United States Patent [19]

Nakajima

[11] Patent Number: 6,007,949
[45] Date of Patent: Dec. 28, 1999

[54] METHOD OF EXTRACTING A MASK PATTERN FOR AN ELECTRON BEAM EXPOSURE

[75] Inventor: Ken Nakajima, Tokyo, Japan

[73] Assignee: NEC Corporation, Tokyo, Japan

[21] Appl. No.: 08/924,535

[22] Filed: Sep. 5, 1997

[30] Foreign Application Priority Data

Sep. 10, 1996 [JP] Japan ................................ 8-239005

[51] Int. Cl.$^6$ ........................................................ G03F 9/00
[52] U.S. Cl. ................................ 430/5; 430/30; 430/296
[58] Field of Search ................................ 430/5, 30, 296

[56] References Cited

FOREIGN PATENT DOCUMENTS 5-343304  12/1993  Japan .
9-97759   4/1997   Japan .

OTHER PUBLICATIONS

Y. Nakayama, et al., "Electron–beam cell projection lithography: A new high–throughput electron–beam direct–writing technology using a specially tailored Si aperture", J. Vac. Sci. Technol. B., vol. 8, No. 6, Nov./Dec. 1990, pp. 1836–1840.

*Primary Examiner*—Christopher G. Young
*Attorney, Agent, or Firm*—Whitham, Curtis & Whitham

[57] ABSTRACT

In a method of forming a mask from a design pattern, a mask pattern is repeated in the design pattern and is checked about whether or not the mask pattern has the same line width at a border. If the mask pattern having the same line width is divided, a portion having the same line width adjacent to the border is removed from the mask pattern. The removed mask pattern is actually used as the mask for the electron beam exposure.

As a result, when electron beam exposure is made by the use of the mask, exposed patterns are partially overlapped with each other at adjacent ones of the exposed patterns and contiguous to each other at portions having different line widths. With this structure, the electron beam exposure is performed without registration errors between the exposed patterns contiguous to each other.

10 Claims, 6 Drawing Sheets

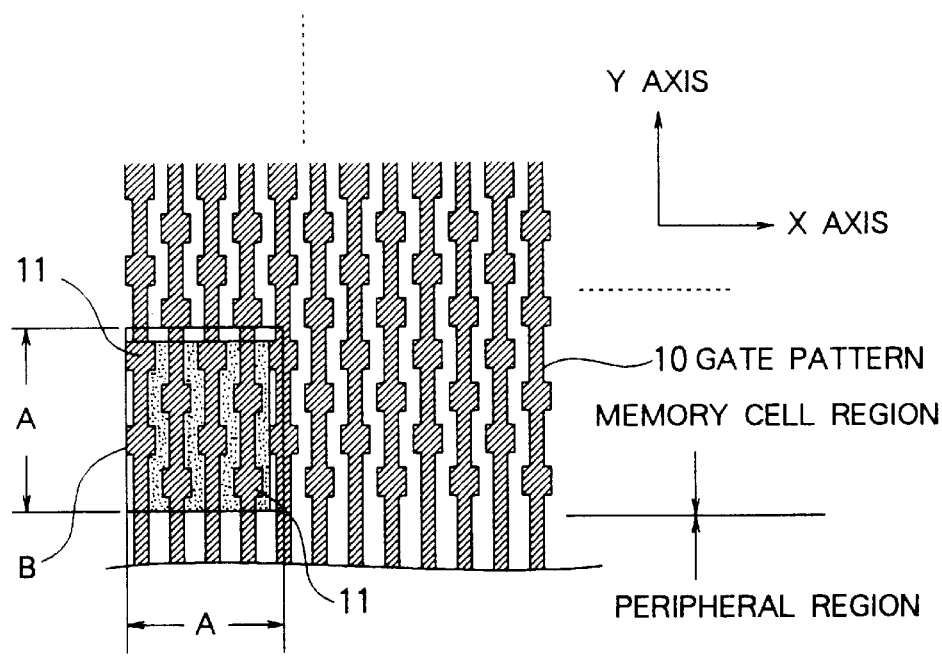
FIG. 2A
PRIOR ART
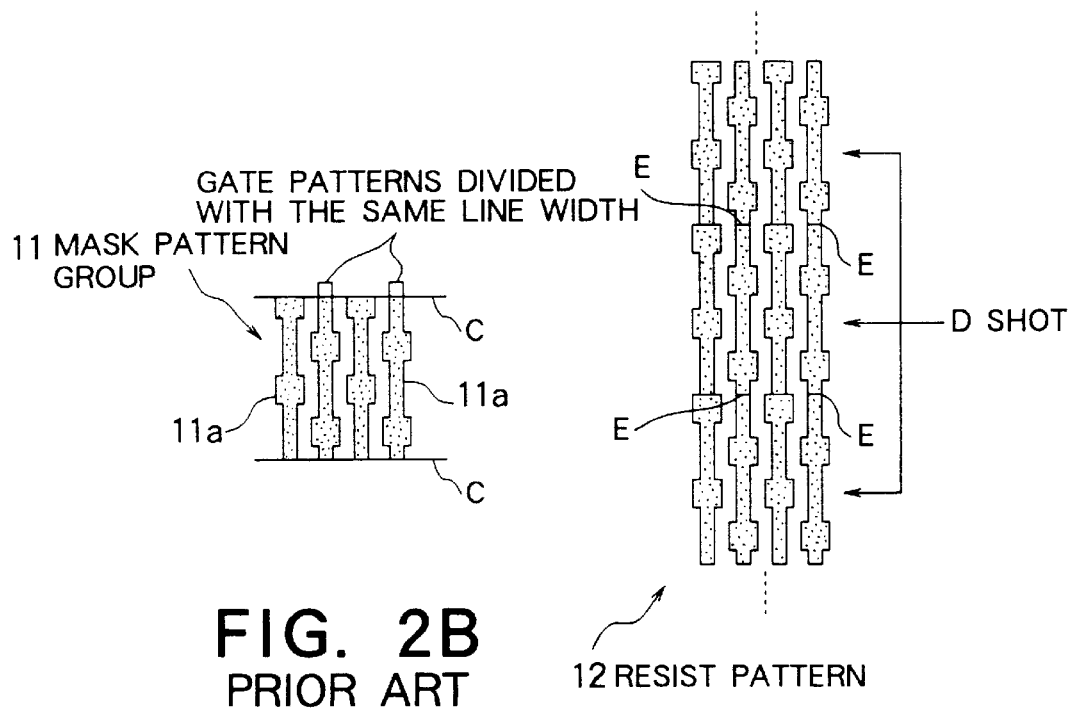
FIG. 2B
PRIOR ART
FIG. 2C
PRIOR ART

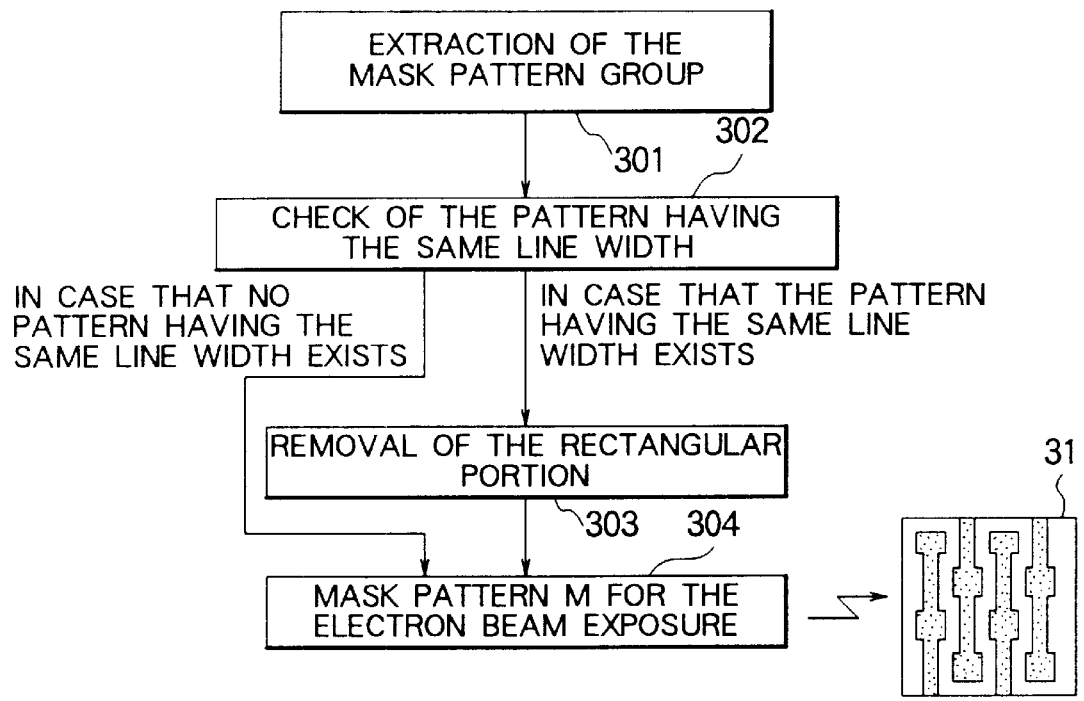
FIG. 3B
FIG. 3D
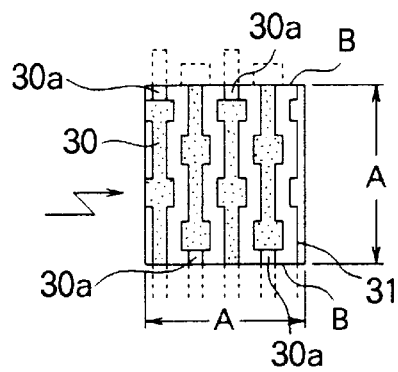
FIG. 3C

METHOD OF EXTRACTING A MASK PATTERN FOR AN ELECTRON BEAM EXPOSURE

BACKGROUND OF THE INVENTION

This invention relates to a method of extracting a mask pattern for an electron beam exposure, and in particular, to an electron beam cell projection lithography.

Recently, a design rule (that is, a minimum line width) of an ultra-large-scale integration (ULSI) has been reduced to a critical state. Therefore, as long as an optical lithography technique is used, it is difficult to fabricate the USLI by the use of such an optical lithography technique.

To solve this problem, an electron beam direct delineation technique has been proposed.

However, the electron beam direct delineation technique has a poor throughput as compared to the optical lithography technique, since in the electron beam direct delineation technique, the exposure is performed by successively scanning a focused electron beam to delineate a pattern.

In order to improve the throughput, an electron beam cell projection lithography technique has been developed.

In such an electron beam cell projection lithography, a mask is used to perform the electron beam exposure like the optical lithography.

In the electron beam cell projection lithography, a mask pattern is extracted from a design pattern data with a maximum beam size of the electron beam or a beam size similar to the maximum size.

As the mask pattern, a pattern which is repeated in the design pattern is generally selected. By using this mask pattern, the electron beam exposure is performed.

The conventional extracting method is disclosed in Japanese Unexamined Patent Publication No. H5-343304. In the conventional method, the repeated pattern is mechanically extracted with a partial beam region similar to the maximum beam size from a design pattern.

In the conventional method, a pattern having the same line width is divided. By using the extracted pattern, a mask for the electron beam exposure is formed. Further, by using the mask, the electron beam exposure is performed. This electron beam exposure is performed by successively moving a partial shot region.

However, in this case, the exposed patterns are connected to each other with the same line widths at the boundary of the shot region, resulting in a registration error. The registration errors cause deterioration of dimension accuracy of a printed resist pattern. Since in accordance with the recent high integration and high finalization, dimension accuracy of 0.02 $\mu$m or less is required, it is indispensable that the registration error is eliminated.

SUMMARY OF THE INVENTION

It is therefore an object of this invention to eliminate a registration error.

According to this invention, a method of pre-processing a mask pattern data signal into a pre-processed mask pattern before exposure of a mask pattern represented by the mask pattern data signal, the mask pattern data signal being produced by partitioning a mask pattern into a plurality of unit mask patterns each of which is laid within a predetermined area surrounded by a boundary and which is contiguous to an adjacent one of the unit mask patterns, the predetermined area being divided into a boundary area adjacent to the boundary and a center area surrounded by the boundary area, each of the unit mask patterns having a pattern segment which has a first preselected width in the boundary area and a second preselected width in the remaining area except for the boundary area and which is extended to the adjacent one of the unit mask patterns with the first preselected width kept in the adjacent one of the unit mask patterns, the second preselected width being wider than the first preselected width, the method comprising:

detecting that the unit mask pattern in the predetermined area is contiguous to the adjacent one of the unit mask patterns in the first preselected width;

removing a part of the first preselected width from the boundary area of the predetermined area to leave a partially removed unit mask pattern having the second preselected width; and using the partially removed unit mask pattern as the pre-processed mask pattern.

Further according to this invention, a method of exposing the pre-processed mask pattern to an electron beam bundle to transcribe the pre-processed mask pattern on a wafer, the method comprising the steps of:

repeating exposure of the pre-processed mask pattern on the wafer by the electron beam bundle so that the pre-processed mask pattern of the first preselected width is contiguous to a portion of the second preselected width of the pre-processed mask pattern.

In this invention, the exposed patterns are connected to each other with different line widths, since the portion having the same line width is removed in advance. Therefore, the electron beam exposure is performed without registration errors between the patterns connected to each other.

BRIEF DESCRIPTION OF THE DRAWINGS

FIGS. 2A through 2C show a conventional method of extracting a mask pattern.

FIGS. 3A through 3D show a method of extracting a mask pattern according to this invention.

DESCRIPTION OF THE PREFERRED EMBODIMENT

Figure 1:
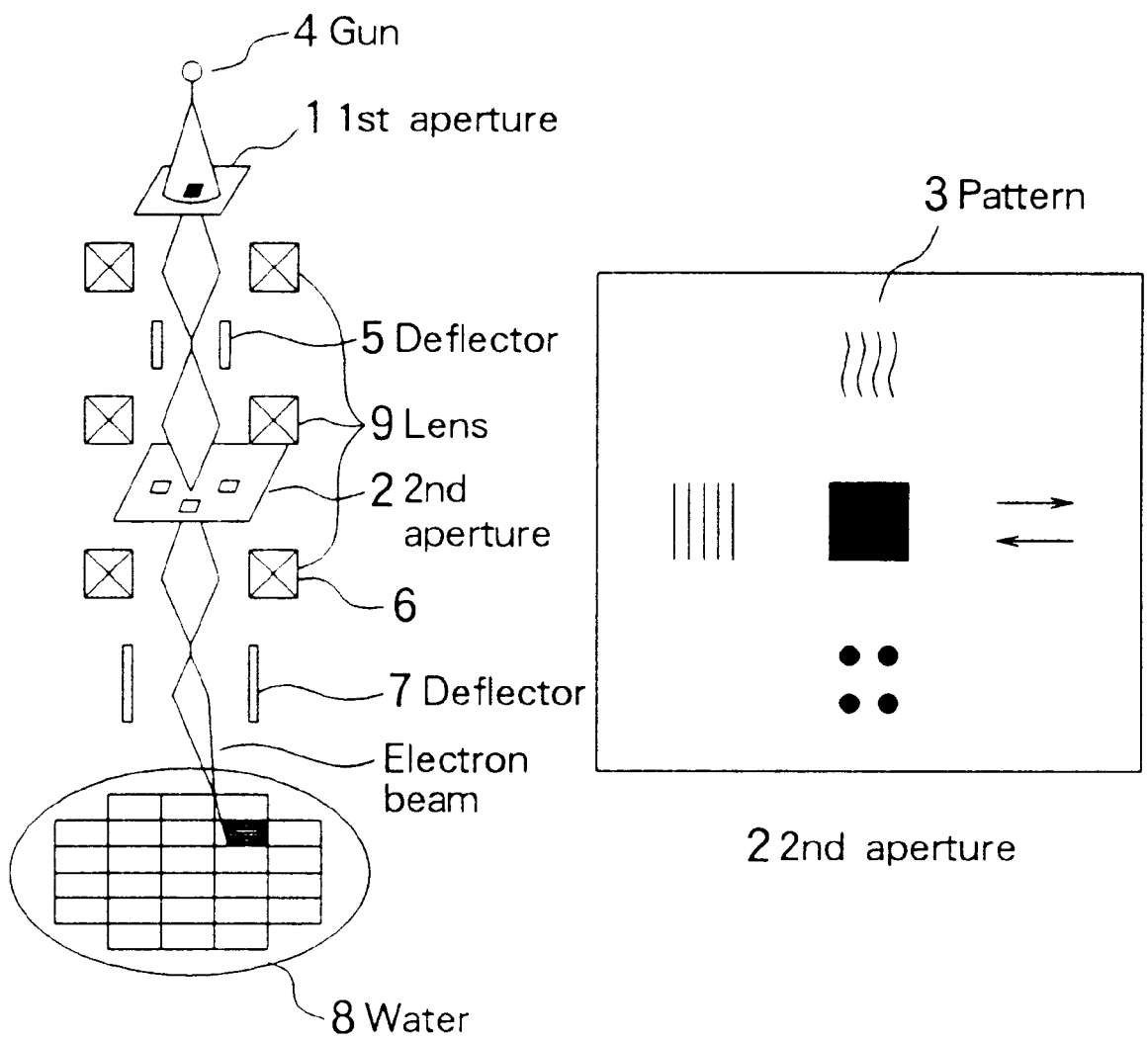
FIG. 1 shows a constitution of the conventional electron beam apparatus.

Referring to FIGS. 1 and 2, a conventional pattern extracting method will first be described for a better understanding of this invention. The pattern extracting method is equivalent to the conventional pattern extracting method in the preamble of the instant specification.

Referring to FIG. 1, a constitution of an electron beam writing apparatus for an electron beam projection lithography will first be described.

The apparatus comprises a first aperture 1 and a second aperture 2. The first and second apertures 1 and 2 shape an electron beam. A mask pattern extracted from a design pattern is formed on the second aperture 2 as a partial pattern opening 3. The electron beam emitted from a gun 4 is shaped via the first aperture 1. Thereafter, the shaped electron beam is irradiated for the partial pattern opening 3 on the second aperture 2 via a deflector 5 and lens 9. The electron beam shaped by the partial pattern opening 3 is contracted by a lens 6 and irradiated on a wafer 8 via a deflector 7. Thus, since the mask pattern which is repeated in the design pattern is formed on the second aperture 2 as the partial pattern opening 3, the electron beam exposure is performed with a reduced shot number. As a result, the throughput is considerably increased (For example, Y. Nakayama et al., J. Vac. Sci. Technol. B8, 1836 (1990)).

Referring to FIG. 2A, gate patterns 10 in a memory (DRAM) are shown as a design pattern. The gate patterns 10 are repeated in a X axis direction and a Y axis direction. A mask pattern group 11 positioned in a beam region B similar to a maximum beam size A is divided and extracted from the gate patterns 10 (design pattern).

The patterns 11a among the extracted pattern group 11 are divided with the same line width at the border C of the beam region B as shown in FIG. 2B. A mask for the electron exposure is formed by using the extracted pattern group 11. By using the mask, electron beam partial shots D are repeatedly performed for the wafer as shown in FIG. 2C. In this case, as shown in FIG. 2C, registration errors E occur between the partial shots D, since resist patterns 12 having the same line width are connected to each other at end portions thereof. This registration errors E cause deterioration of the dimension accuracy of the exposed resist pattern 12.

Taking the above-mentioned problem into consideration, this invention provides a pattern extracting method which is capable of extracting a mask pattern without registration errors.

An embodiment according to this invention will be described below.

Figure 3A:
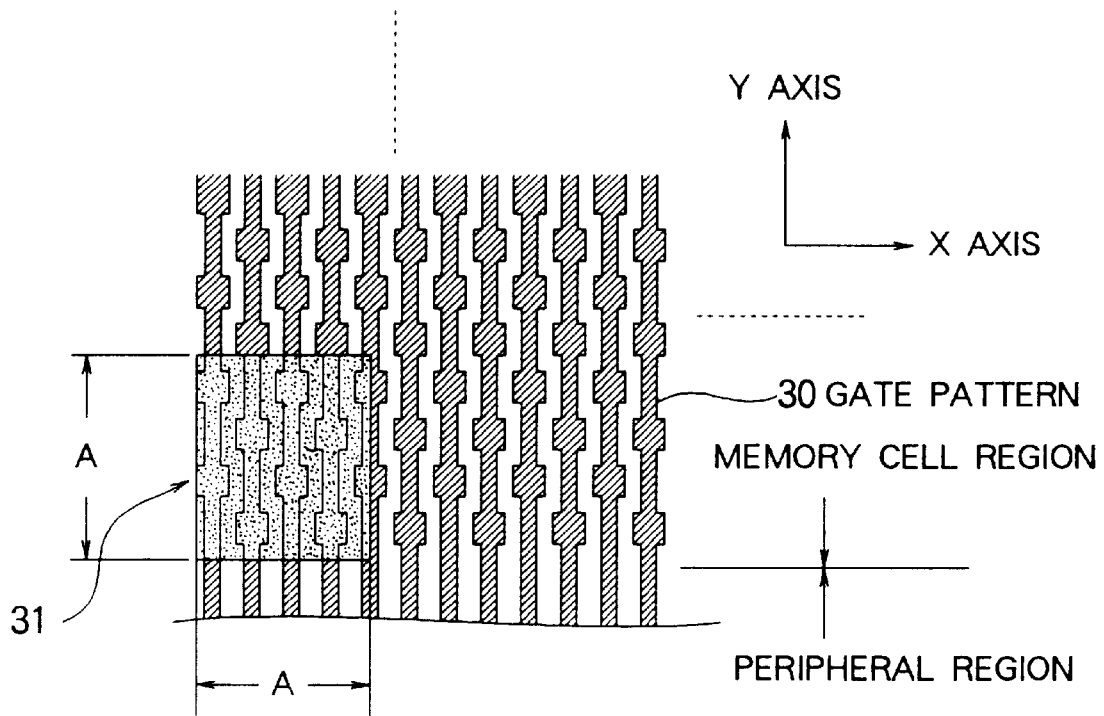

FIG. 3A shows gate patterns 30 in a memory(DRAM). The gate patterns 30 are repeated in a X axis direction and a Y axis direction. A mask pattern group 31 positioned in a maximum beam size A is divided and extracted from the gate patterns 30 (design pattern).

FIG. 3B shows a flow chart for extracting the mask pattern group 31 from a gate pattern 30.

First, the mask pattern group 31 is divided and extracted with the maximum beam size A from the gate patterns 30 (step 301).

The mask pattern group 31 is repeated in the gate patterns 30. The maximum beam size A is designed in such a manner that a partial shot of the electron beam is performed in the size.

Next, whether or not the pattern 30 having the same line width at borders B is divided is checked (step 302).

Where the pattern 30 having the same line width is divided, a rectangular portion 30a having the same line width adjacent to the border B is removed from the mask pattern group 31 (step 303).

Thus, a removed mask pattern shown in FIG. 3D is actually used as the mask pattern M for the electron beam exposure (step 304).

Where the pattern 30 having the same line width is not divided, the extracted pattern itself is actually used for the mask pattern M for the electron beam exposure(step 304).

Subsequently, referring to FIG. 4, a method of forming a mask for electron beam exposure using the above mentioned mask pattern (shown in FIG. 3D) is described below.

Figure 4A:
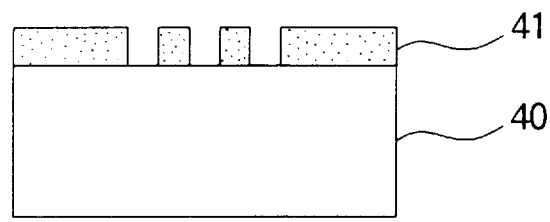
FIGS. 4A through 4E show a method of forming a mask for an electron beam exposure according to this invention.

First, as shown in FIG. 4A, the mask pattern is patterned on a silicon substrate 40 to form a mask 41 for etching.

Figure 4B:
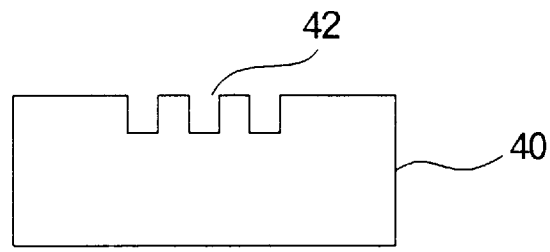

Next, as shown in FIG. 4B, the silicon substrate 40 is etched to form a desired pattern groove 42.

Figure 4C:
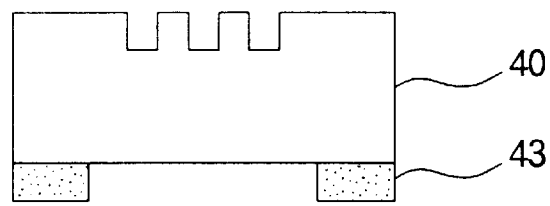

Next, as shown in FIG. 4C, patterning for back etching is performed to form a mask 43 for the back etching.

Figure 4D:
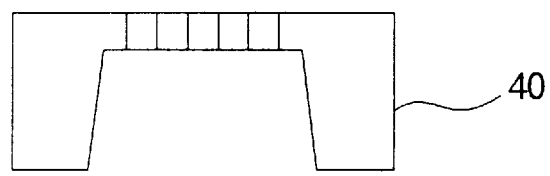

By using the mask 43 for the back etching, the etching is performed at the back surface of the substrate 40 in KOH solution as shown in FIG. 4D.

Figure 4E:
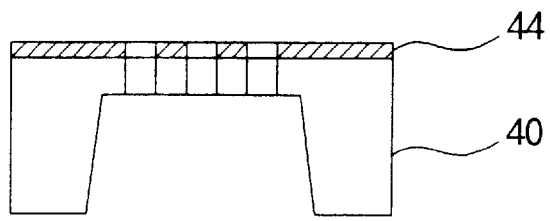

Finally, as shown in FIG. 4E, a conductive layer 44 such as Au, W, Ti is deposited on the substrate 40.

Thus, the mask for the electron beam exposure is formed.

In FIG. 4, although the back etching is performed after the patterning and etching for the upper surface of the substrate, the back etching may be performed before the patterning and etching for the upper surface.

Subsequently, referring to FIG. 5, a method of exposing using the above mentioned mask will be described below.

Figure 5A:
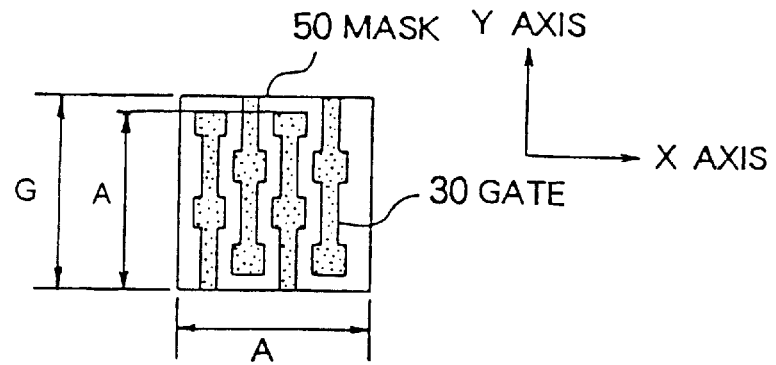
FIGS. 5A and 5B show a method of exposing using a mask according to this invention.

FIG. 5A shows the mask 50 formed through the steps shown in FIG. 4. The mask 50 comprises the gate patterns 30 shown in FIG. 3. Further, the mask 50 has the maximum beam size A. By using the mask 50, the partial shot is sequentially performed in the X axis direction and the Y axis direction shown in FIG. 5B. The shot in the X axis direction is performed with a pitch F. The shot in the Y axis direction is performed with a pitch G. In this case, the pitches F, G are the maximum beam size A or less.

Figure 5B:
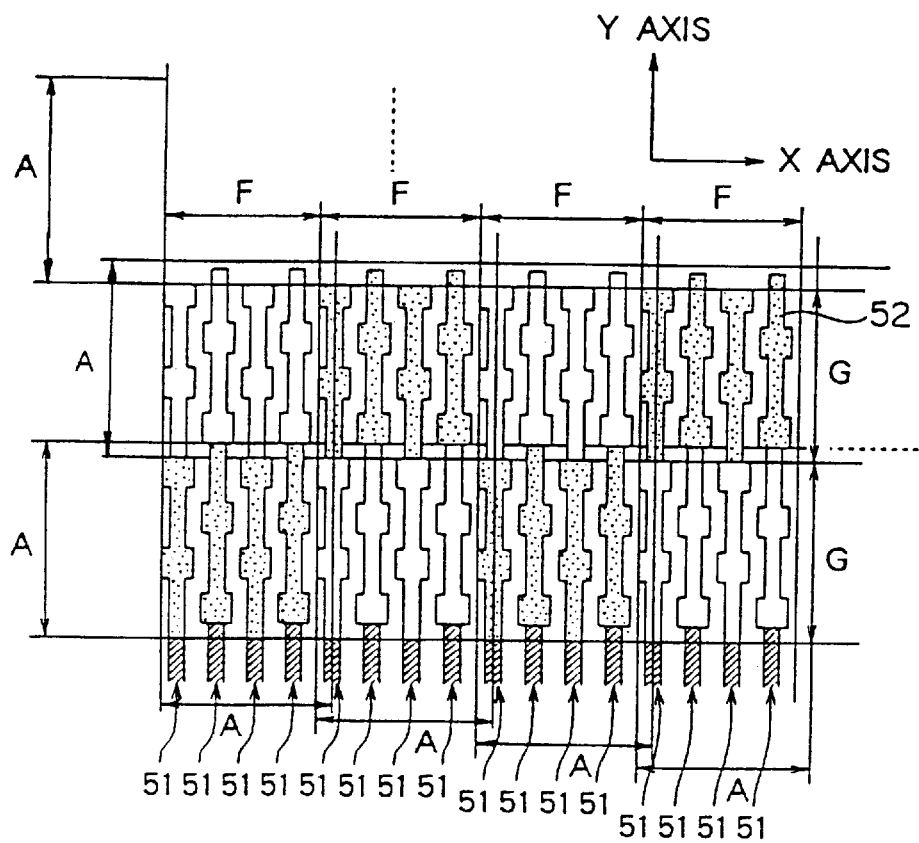

As shown in FIG. 5B, the exposed patterns 52 are connected to each other with different line widths. This is because the rectangular portion 30a having the same line width is removed from the pattern group 31 in advance as shown in FIGS. 3C and 3D. Therefore, the electron beam exposure is performed without registration errors between the patterns 52 connected to each other as shown in FIG. 5B.

Also, partial gate patterns 51 which are removed in extracting the mask pattern are exposed by a known variable shaped method.

In the above embodiment, although the exposed pattern is the gate patterns in the memory, this invention is not limited to the gate patterns, and may applied to other patterns.

What is claimed is:

1. A method of pre-processing a mask pattern into a plurality of repeating unit mask patterns each of said unit mask patterns being laid in a predetermined center area surrounded by a boundary area, each said unit mask pattern containing a plurality of pattern segments, each said pattern segment extending across said boundary area into an adjacent unit mask pattern, wherein said boundary area lying between adjacent unit mask patterns is said boundary area for each of said adjacent unit mask patterns, the method comprising:

extracting said repeating mask pattern, wherein each said pattern segment has respective first and second preselected widths within said boundary area, thereby forming within said boundary area first and second contiguous rectangular portions of said pattern segment corresponding to said respective widths, wherein said first rectangular portion is further away from said center area;

for each said pattern segment, removing said first rectangular portion from said boundary area to leave a partially removed unit mask pattern having said second rectangular portion; and using the partially removed unit mask pattern as said pre-processed mask pattern.

2. The method of claim 1, wherein said center area is rectangular.

3. The method of claim 2, wherein for at least one of said plurality of pattern segments said second preselected width ends and said first preselected width begins where said center area ends and said boundary area begins.

4. The method of claim 2, wherein for all of said pattern segments said second selected width is wider than said first selected width.

5. The method of claim 2, wherein said first selected width is the same for each of said pattern segments and wherein said second selected width is the same for each of said pattern segments.

6. A mask for use in electron beam cell projection lithography, said mask having a predetermined center area surrounded by a boundary area, said mask containing a plurality of pattern segments, each said pattern segment having a first preselected width and a second preselected width within said boundary area, thereby forming within said boundary area first and second contiguous rectangular portions of said pattern segment corresponding to said respective widths, wherein said first rectangular portion is further away from said center area;
each said pattern segment being arranged in said boundary area so that said first rectangular portion is removed.

7. The mask of claim 6, wherein said center area is rectangular.

8. The mask of claim 7, wherein for at least one of said plurality of pattern segments said second preselected width ends and said first preselected width begins where said center area ends and said boundary area begins.

9. The mask of claim 7, wherein for all of said pattern segments said second selected width is wider than said first selected width.

10. The mask of claim 7, wherein said first selected width is the same for each of said pattern segments and wherein said second selected width is the same for each of said pattern segments.

* * * * *